United States Patent [19]

Kao et al.

[11] Patent Number: 5,361,763
[45] Date of Patent: Nov. 8, 1994

[54] METHOD FOR SEGMENTING FEATURES IN AN IMAGE

[75] Inventors: Yi-Hsuan Kao; James A. Sorenson; Mark M. Bahn, all of Madison, Wis.

[73] Assignee: Wisconsin Alumni Research Foundation, Madison, Wis.

[21] Appl. No.: 25,004

[22] Filed: Mar. 2, 1993

[51] Int. Cl.$^5$ ............................................. A61B 5/055
[52] U.S. Cl. ........................... 128/653.2; 364/413.13; 364/413.14; 364/413.16; 364/413.19; 128/653.1; 382/9; 382/18
[58] Field of Search ........................ 128/653.1, 653.2; 324/309; 364/413.13, 413.15–413.19; 382/9, 16–18, 19, 22, 23, 51

[56] References Cited

U.S. PATENT DOCUMENTS

| 4,665,367 | 5/1987 | Kramer et al. | 324/309 |
| 4,856,528 | 8/1989 | Yang et al. | 382/22 |
| 4,908,578 | 3/1990 | Van Liere | 324/309 |
| 4,922,915 | 5/1990 | Arnold et al. | 382/18 |
| 5,072,384 | 12/1991 | Doi et al. | 364/413.13 |
| 5,107,838 | 4/1992 | Yamaguchi | 128/653.2 |
| 5,185,809 | 2/1993 | Kennedy et al. | 382/18 |
| 5,262,945 | 11/1993 | DeCarli et al. | 364/413.13 |

OTHER PUBLICATIONS

Paper by Joe P. Windham et al. entitled "Eigenimage Filtering in MR Imaging, Journal of Computer Assisted Tomography," Jan./Feb. 1988.
Neuroradiology, "Alzheimer Disease: Measuring Loss of Cerebral Gray Matter With MR Imaging," by Henry Rusinek et al., vol. 178, No. 1, Jan. 1991, pp. 109–114.
Journal of Computer Assisted Tomography, "Graphical Analysis of MR Feature Space For Measurement of CSF, Gray–Matter, and White–Matter Volumes", vol. 17, No. 3, May/Jun. 1993, pp. 461–470.

Primary Examiner—Lee S. Cohen
Assistant Examiner—Brian L. Casler
Attorney, Agent, or Firm—Quarles & Brady

[57] ABSTRACT

A dual echo magnetic resonance imaging system produces two registered images of a patient in which the images have different contrast relationships between different tissue types. A two dimensional feature space histogram of the two images is produced and a separate centroid is located in the feature space histogram for each one of a pair of tissue types. A Cartesian coordinate system is defined in the feature space so that one axis of the system passes through the two centroids. Vector decomposition is employed to project each image element data point in the feature space onto a point on the one axis. The fractional quantity of each tissue type present in the image element is determined based upon the Euclidean distances from that axis point to the respective centroids. The fractional quantity is calculated for each element in the original images to form a pair of tissue images. The elements of a tissue image are processed to measure the amount of that tissue type in the imaged portion of the patient.

12 Claims, 6 Drawing Sheets

S1 IMAGE

FIG. 5A

S2 IMAGE

TISSUE A IMAGE

FIG. 8A

TISSUE B IMAGE

METHOD FOR SEGMENTING FEATURES IN AN IMAGE

BACKGROUND OF THE INVENTION

The field of the invention is image processing and more particularly, to the processing of medical images, such as those acquired by magnetic resonance, computed tomography or positron emission tomography, in order to enhance features in the image.

As the invention has particular application to magnetic resonance imaging, it will be described in that context. Any nucleus of an atom which possesses a magnetic moment attempts to align itself with the direction of the magnetic field in which it is located. In doing so, however, the nucleus precesses around this direction at a characteristic angular frequency (Larmor frequency) which is dependent on the strength of the magnetic field and on the properties of the specific nuclear species (the magnetogyric constant g of the nucleus). Nuclei which exhibit this phenomena are referred to herein as "spins".

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. A net magnetic moment $M_z$ is produced in the direction of the polarizing field, but the randomly oriented magnetic components in the perpendicular, or transverse, plane (x-y plane) cancel one another. If, however, the substance, or tissue, is subjected to a magnetic field (excitation field $B_1$) which is in the x-y plane and which is near the Larmor frequency, the net aligned moment, $M_z$, may be rotated, or "tipped", into the x-y plane to produce a net transverse magnetic moment $M_t$, which is rotating, or spinning, in the x-y plane at the Larmor frequency. The practical value of this phenomenon resides in the signal which is emitted by the excited spins after the excitation signal $B_1$ is terminated. There are a wide variety of measurement sequences in which this nuclear magnetic resonance ("NMR") phenomena is exploited.

When utilizing NMR to produce images, a technique is employed to obtain NMR signals from specific locations in the subject. Typically, the region which is to be imaged (region of interest) is scanned by a sequence of NMR measurement cycles which vary according to the particular localization method being used. The resulting set of received NMR signals are digitized and processed to reconstruct the image using one of many well known reconstruction techniques. To perform such a scan, it is, of course, necessary to elicit NMR signals from specific locations in the subject. This is accomplished by employing magnetic fields ($G_x$, $G_y$, and $G_z$) which have the same direction as the polarizing field $B_0$, but which have a gradient along the respective x, y and z axes. By controlling the strength of these gradients during each NMR cycle, the spatial distribution of spin excitation can be controlled and the location of the resulting NMR signals can be identified.

NMR is a very useful imaging modality for medical diagnosis. A typical application involves imaging a brain to detect a tumor and determine the location of the tumor. It also is desirable to be able to determine the volume of the tumor from an NMR image. This becomes difficult as not every volume element (voxel) of the image is entirely tumor or entirely normal tissue, instead voxels at the edge of, and even within, the tumor are formed by different proportions of each type of tissue. Therefore it is desirable to develop a method for determining those proportions on a voxel by voxel basis in order to accurately assess the volume of each tissue type.

SUMMARY OF THE INVENTION

First and second registered images of an object are acquired wherein the images have different contrasts among features in the images and wherein each image is formed by a two-dimensional array of image elements. For example dual-echo magnetic resonance imaging can be used to acquire the pair of registered images.

An object of the present invention is to provide a method by which different features in an acquired image can be segmented. Toward this object, a two dimension feature space histogram of intensity levels of the image elements in the first and second images is created. First and second centroids are located in the feature space histogram wherein the first and second centroids respectively correspond to first and second features in the images.

A Cartesian coordinate system is defined in the feature space histogram the origin is located at the first centroid and one axis passing through the second centroid. For each image element in one of the images, a vector that defines the location for the image element in the feature space histogram is decomposed into a component vector along the one axis. The resultant component vectors are used to determine fractional quantities of the first and second features in image elements. For example, in a medical imaging system the fractional amounts of two different tissue types represented in a image element can be determined in this manner.

Another object is to produce a separate image containing a segmented feature from the acquired image and information about the fractional quantity of each feature in the elements of the acquired image. In practice a separate image is produced for each feature segmented from the acquired image. A first feature image is formed by setting the value of its elements to the fractional quantity of the first feature in the corresponding elements of the first image. A second feature image is formed in a similar manner using the fractional quantities of the second feature.

A further object of the present invention is to provide a technique by which the fractional quantity of a feature in each image element is employed to measure a physical parameter of the feature. Each of the feature images can be employed to derive a measurement of a physical parameter of the corresponding feature from the elements of the feature image. For example, the space of a feature is measured by knowing the amount of space represented by each image element and separately multiplying that amount of space by each fractional quantity in one of the feature images. The series of products from that multiplication are summed to provide a total space measurement of the feature. The feature images also can be displayed as images in which the associated feature has been enhanced.

Still another object of the present invention is to provide a non-invasive technique by which the volume of a tumor within a patient can be measured. In this application of the invention,, each image element depicts a volume within the portion of the patient being imaged and that volume is the amount of space referred to in the preceding paragraph. Thus the fractional quantity data can be employed to measure the total volume of the tumor by taking several image slices through the patient, determining the amount of tumor depicted in each image, and summing those amounts for all of the images.

The foregoing and other objects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims herein for interpreting the scope of the invention.

DETAILED DESCRIPTION OF THE INVENTION

Figure 1:
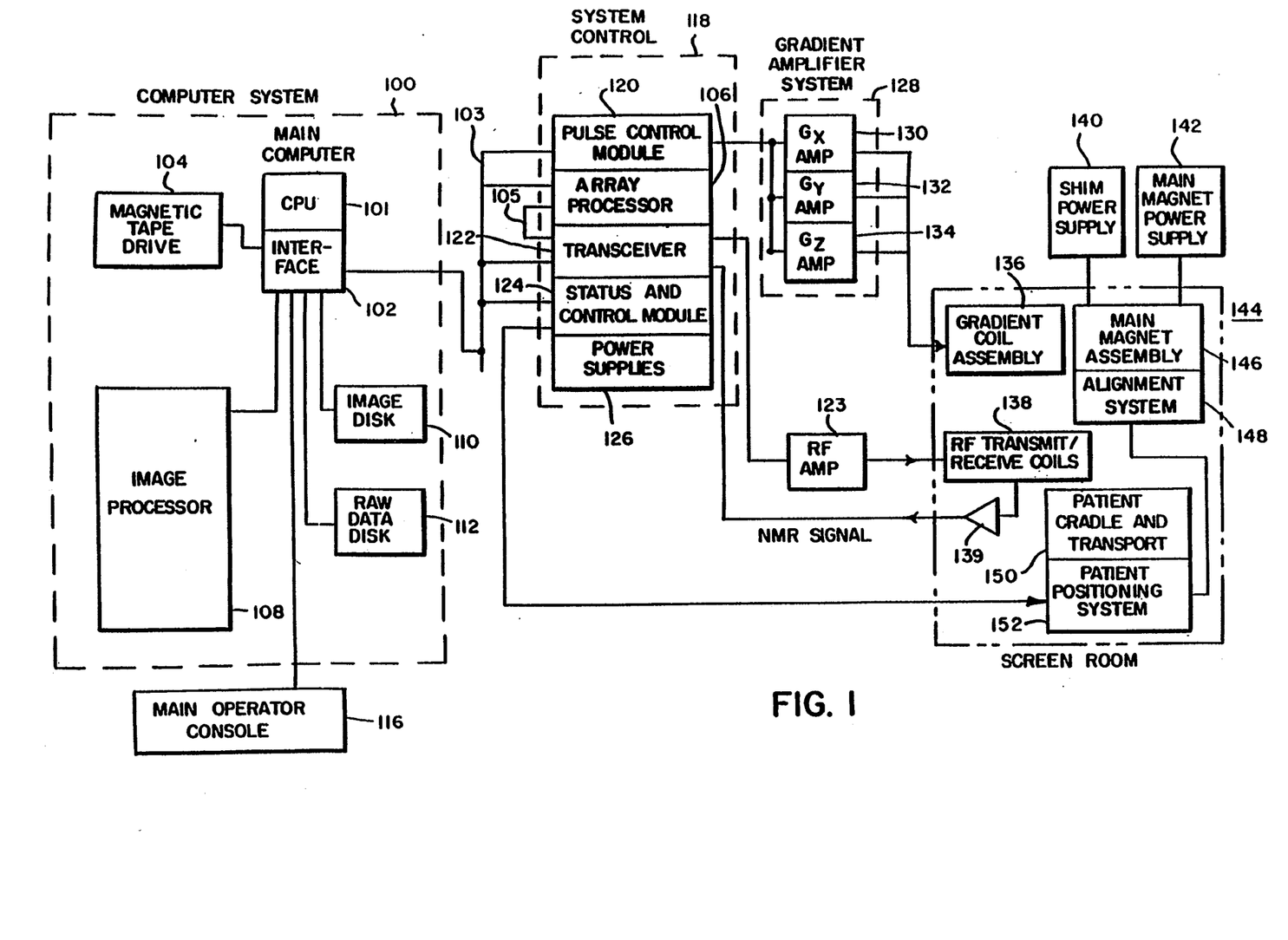
FIG. 1 is a block diagram of an NMR system which employs the present invention.

Referring first to FIG. 1, there is shown in block diagram form the major components of a preferred NMR system which incorporates the present invention. The overall operation of the system is under the control of a host computer system generally designated 100 which includes a computer 101 (such as a Data General MV7800). The computer has associated therewith an interface 102 through which a plurality of computer peripheral devices and other NMR system components are coupled. Among the computer peripheral devices is a magnetic tape drive 104 which may be utilized under the direction of the main computer for archiving patient data and images to tape. The computer system is provided with a means to store raw data (i.e. before image construction) utilizing a disc data storage system designated 112. The function of image processor 108 is to provide interactive image display manipulation such as magnification, image comparison, gray-scale adjustment and real-time data display. Processed patient data may also be stored in an image disc storage device designated 110. An operator console 116 is also coupled to the computer by interface 102 and provides the operator with the means to input data pertinent to a patient study as well as additional data necessary for proper NMR system operation, such as calibrating, initiating and terminating scans. The operator console also has a CRT monitor to display images stored on discs or magnetic tape.

The computer system 100 exercises control over the NMR system by means of system control 118 and gradient amplifier system 128. The computer 100 communicates with system control 118 via a link 103 in a manner well known to those skilled in the art. The system control 118 includes several subsystems such as a pulse control module (PCM) 120, an array processor 106, a radio frequency transceiver 122, a status and control module (SCM) 124, and the power supplies generally designated 126 necessary to energize the components. The PCM 120 utilizes control signals provided by main computer 101 to generate digital timing and control signals such as the digital waveforms which control gradient coil excitation, as well as RF envelope waveforms utilized in the transceiver 122 for modulating the RF excitation pulses. The gradient waveforms are applied to the gradient amplifier system 128 generally comprised of $G_x$, $G_y$ and $G_z$ amplifiers 130, 132 and 134, respectively. Each amplifier 130, 132 and 134 is utilized to excite a corresponding gradient coil in an assembly generally designated 136. When energized, the gradient coils generate magnetic field gradients $G_x$, $G_y$ and $G_z$ of the magnetic field in the same direction as the main polarizing magnetic field, wherein the gradients are directed in mutually orthogonal X-, Y- and Z-axis directions of a Cartesian coordinate system. That is, if the magnetic field generated by the main magnet (not shown) is directed in the z direction and is termed $B_0$, and the total magnetic field in the z direction is referred to as $B_z$, then $G_x = \partial B_z/\partial x$, $G_y = \partial B_z/\partial y$ and $G_z = \partial B_z/\partial z$, and the magnetic field at any point (x, y, z) is given by $B(x, y, z) = B_0 + G_x X + G_y Y + G_z Z$.

The gradient magnetic fields are utilized in combination with radio frequency pulses generated by transceiver 122, RF amp 123 and RF coil 138 to encode spatial information into the NMR signals emanating from the region of the patient being studied. Waveforms and control signals provided by the pulse control module 120 are utilized by the transceiver subsystem 122 for RF carrier modulation and mode control. In the transmit mode, the transmitter provides a radio frequency waveform modulated in accordance with the control signals to an RF power amplifier 123 which then energizes RF coil 138 which is situated within main magnet assembly 146. The NMR signals radiated by the excited nuclei in the patient are sensed by the same or a different RF coil than is used for transmitting and amplified by a preamplifier 139. The NMR signals are amplified, demodulated, filtered, and digitized in the receiver section of the transceiver 122. The processed NMR signals are transmitted to the array processor 106 for processing by means of a dedicated, unidirectional link 105.

The PCM 120 and SCM 124 are independent subsystems both of which communicate with main computer 101, peripheral system, such as patient positioning system 152, as well as to one another by means of serial communications link 103. The PCM 120 and SCM 124 are each comprised of a 16-bit microprocessor (such as Intel 80286) for processing commands from the main computer 101. The SCM 124 includes means for acquiring information regarding patient cradle position, and the position of the moveable patient alignment light fan beam (not shown). This information is used by main computer 101 to modify image display and reconstruction parameters. The SCM 124 also initiates functions such as actuation of the patient transport and alignment systems.

The gradient coil assembly 136 and the RF transmit and receiver coils 138 are mounted within the bore of the magnet utilized to produce the polarizing magnetic field. The magnet forms a part of the main magnet assembly which includes the patient alignment system 148. A shim power supply 140 is utilized to energize a shim coil associated with the main magnet and which are used to correct inhomogeneities in the polarizing magnet field. In the case of a superconductive magnet, the main power supply 142 is utilized to bring the polarizing field produced by the magnet to the proper operating strength and is then disconnected. The patient alignment system 148 operates in combination with a patient cradle and transport system 150 and patient positioning system 152. To minimize interference from external sources, these NMR system components are enclosed in an RF-shielded room generally designated 144.

Figure 2:
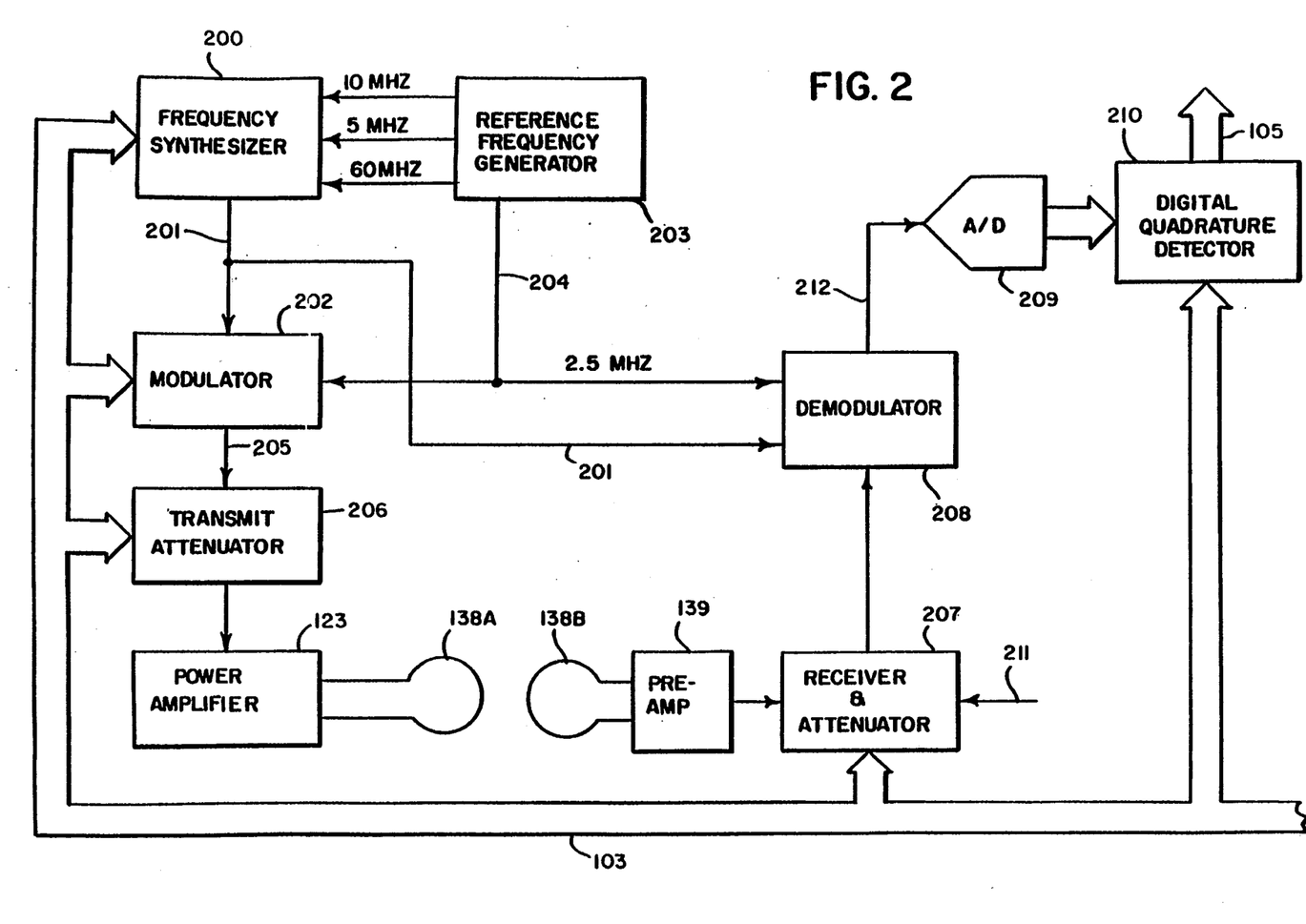
FIG. 2 is an electrical block diagram of the transceiver which forms part of the NMR system of FIG. 1.

Referring particularly to FIGS. 1 and 2, the transceiver 122 includes components which produce the RF excitation field $B_1$ through power amplifier 123 at a coil 138A and components which receive the resulting NMR signal induced in a coil 138B. The base, or carrier, frequency of the RF excitation field is produced under control of a frequency synthesizer 200 which receives a set of digital signals (CF) through the communications link 103 from the main computer 101. These digital signals indicate the frequency and phase of the RF carrier signal which is produced at an output 201. The commanded RF Carrier is applied to a modulator 202 where it is modulated in response to a signal R(t) received through the link 103 from the PCM 120. The signal R(t) defines the envelope, and therefore the bandwidth, of the RF excitation pulse to be produced. It is produced in the PCM 120 by sequentially reading out a series of stored digital values as the RF excitation pulse is produced that represent the desired envelope. These stored digital values may, in turn, be changed by the computer 100 to enable any desired RF pulse envelope to be produced. The magnitude of the RF excitation pulse output through line 205 is attenuated by a transmit attenuator circuit 206 which receives a digital signal, TA, from the main computer 101 through communications link 103. The attenuated RF excitation pulses are applied to the power amplifier 123 that drives the RF transmitter coil 138A. For a more detailed description of this portion of the transceiver 122, reference is made to U.S. Pat. No. 4,952,877 which is incorporated herein by reference.

The NMR signal produced by the subject is picked up by the receiver coil 138B and applied to the input of a receiver 207 through pre-amplifier 139. The receiver 207 amplifies the NMR signal and this is attenuated by an amount determined by a digital attenuation signal (RA) received from the PCM 120 through link 103. The receiver 207 is also turned on and off by a signal through line 211 from the PCM 120 such that the NMR signal is acquired only over the time intervals required by the particular acquisition being performed.

The received NMR signal is at or around the Larmor frequency, which in the preferred embodiment is around 63.86 MHz. This high frequency signal is demodulated in a two step process in a demodulator 208 which first mixes the NMR signal with the carrier signal on line 201 and then mixes the resulting difference signal with the 2.5 MHz reference signal on line 204. The resulting demodulated NMR signal on line 212 has a bandwidth of 125 kHz and it is centered at a frequency of 187.5 kHz. The demodulated NMR signal is applied to the input of an analog-to-digital (A/D) converter 209 which samples and digitizes the analog signal at a rate of 250 kHz. The output of the A/D converter 209 is applied to a digital quadrature detector 210 which produces 16-bit in-phase (I) values and 16-bit quadrature (Q) values corresponding to the received digital signal. The resulting stream of digitized I and Q values of the received NMR signal is output through bus 105 to the array processor where they are employed to reconstruct an image.

To preserve the phase information contained in the received NMR signal, both the modulator 202 in the transmitter section and the demodulator 208 in the receiver section are operated with common signals. More particularly, the carrier signal at the output 201 of the frequency synthesizer 200 and the 2.5 MHz reference signal at the output 204 of the reference frequency generator 203 are employed in both the modulation and the demodulation process. Phase consistency is thus maintained and phase changes in the demodulated received NMR signal accurately indicate phase changes produced by the excited spins. The 2.5 MHz reference signal as well as 5, 10 and 60 MHz reference signals are produced by the reference frequency generator 203 from a common 10 MHz clock signal, and the latter three reference signals are employed by the frequency synthesizer 200 to produce the carrier signal on output 201. For a more detailed description of the receiver, reference is made to U.S. Pat. No. 4,992,736 which is incorporated herein by reference.

Figure 3:
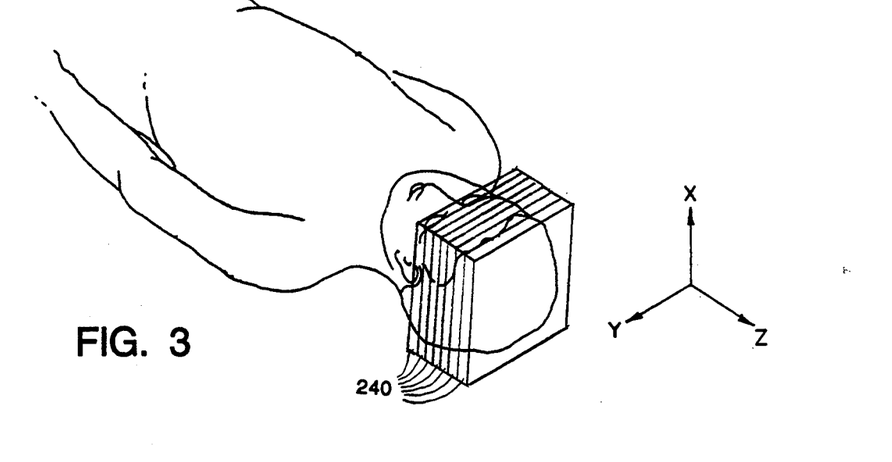
FIG. 3 is a pictorial view showing a typical acquisition of a plurality of NMR data from a patient.

The NMR system in FIG. 1 performs a series of pulse sequences to collect sufficient NMR data to reconstruct a pair of images. Each pair of images represents two different versions of a slice 240 taken through the head of a patient, as shown in FIG. 3 for example. The scan is conducted under the direction of a conventional program which is executed by the main computer 101 in the NMR system in FIG. 1. This program directs the system to perform a series of pulse sequences to acquire NMR data for subsequent processing according to the present invention. The preferred embodiment of the invention is implemented by performing the pulse sequence of FIG. 4. At time $T_0$, a 90 degree RF pulse 200 is generated within the transceiver 122 and applied via the RF amplifier 123 to the transmit/receive coils 138. As will be understood, appropriate gradient signals are applied via amplifier system 128 to the gradient coil assembly 136, as is conventional practice. For example, the Z slice select pulse determines which slice 240 is selected for a given scan and is changed to scan each slice. The Y phase encoding gradient pulse is stepped through 256 discrete values during the scan to acquire 256 separate views of each slice 240.

Figure 4:
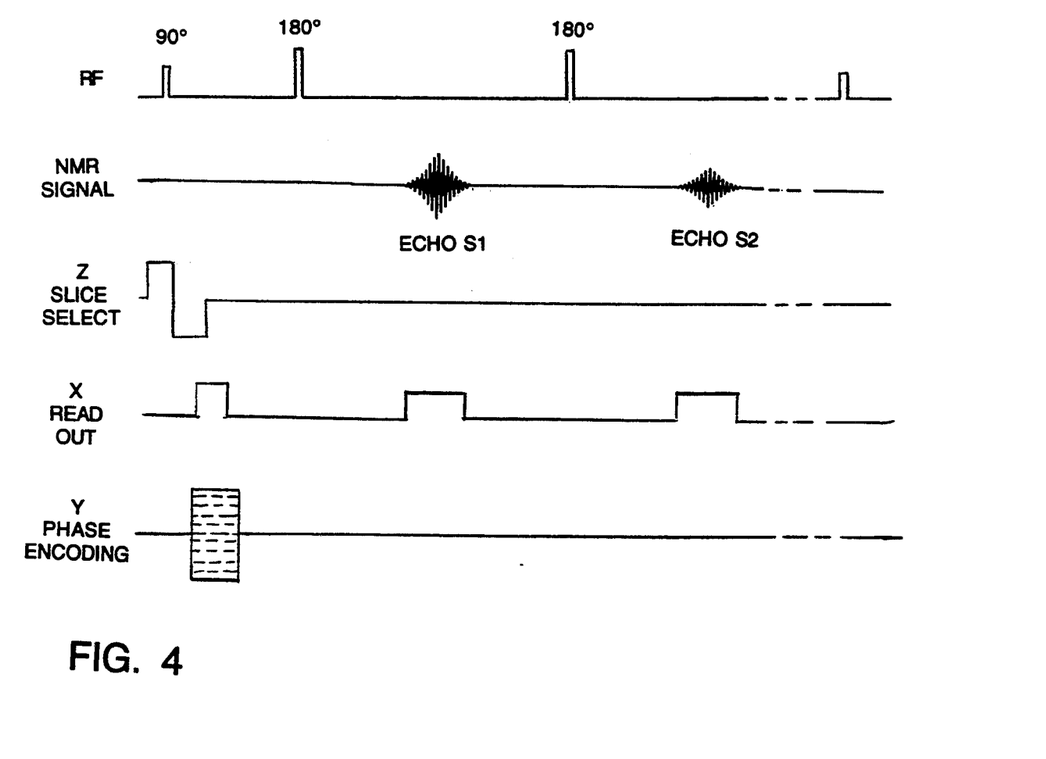
FIG. 4 is a graphical depiction of an NMR pulse sequence used to acquire dual echo data.

Shortly after the 90° pulse, a 180° RF signal pulse is applied to the transmit/receive coils 138. This pulse induces a first echo signal $E_1$ in the NMR signal. This echo pulse $E_1$ is detected by the transmit/receive coil 138 and applied via preamplifier 139 and transceiver 122 where it is digitally sampled. The digital samples of the $E_1$ echo are stored in a first K-space array within the raw data disk 112 of computer system 100. Subsequently to the echo signal $E_1$, a second 180° RF pulse is applied to the transmit/receive coil 138. This in turn creates a second echo pulse $E_2$ in the NMR signal. This echo pulse is digitized by the transceiver 122 as previously described and the digital value is stored in a second K-space array within the raw data disk 112. This pulse sequence is then repeated a number of times (e.g. 256) to acquire all of the data values for the two K-space arrays containing the $E_1$ and $E_2$ echo signal data.

The image processor 108 uses conventional Fourier analysis or back projection techniques to construct separate images $S_1$ and $S_2$, respectively, from the dual echo K-space arrays. The first image $S_1$ is density weighted while the second image $S_2$ is weighted by the $T_2$ exponential decay constant. Because the two images are acquired during the same pulse sequence, their image elements will be in perfect registration so that anatomical features lie in identical locations within each image. However, because of the different image weighting, anatomical features have different luminance intensities between the two images. Each of the two images $S_1$ and $S_2$ is represented by a two-dimensional array of volume elements (voxels) and because the two images are registered with respect to one another, correspondingly located voxels in each image are two depictions of the same volume within the patient. The signal detected for each voxel is a linear sum of the signals produced by each type of tissue in the corresponding volume of the patient.

Figure 5A:
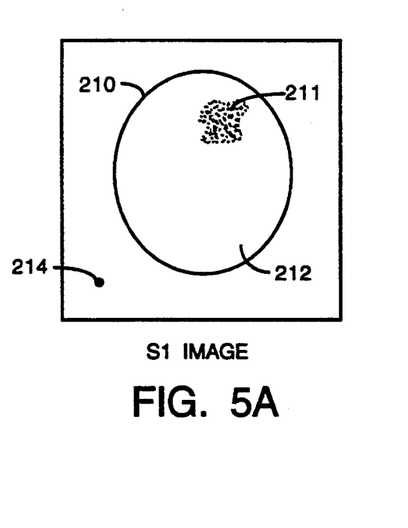
FIGS. 5A and 5B are representations of two images produced from the dual echo data.
Figure 5B:
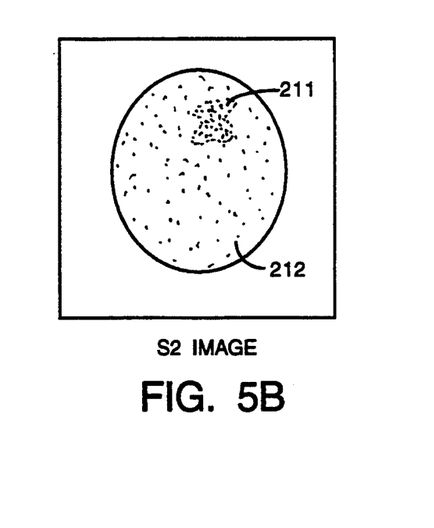

An example of an $S_1$ image is shown in FIG. 5A and depicts a slice through the head of the patient in which oval 210 delineates the skull and area 211 represents one type of tissue, such as that found in a tumor, while the remaining area 212 within the skull represents normal tissue. In the density-weighted $S_1$ image, a sharp contrast exists between the tumor tissue in area 211 and the normal brain tissue in area 212. FIG. 5B is an example of a corresponding $S_2$ image which in this illustration because of different signal parameter weighting has less contrast between the area 211' and area 212'. Both the $S_1$ and $S_2$ images are stored in the image disk 110 of the main computer 100 for examination by the operator via console 116 and further processing according to the present invention. The two images $S_1$ and $S_2$ then can be processed further to enhance the tumor and the processing result used to calculate the volume of the tumor.

Figure 6:
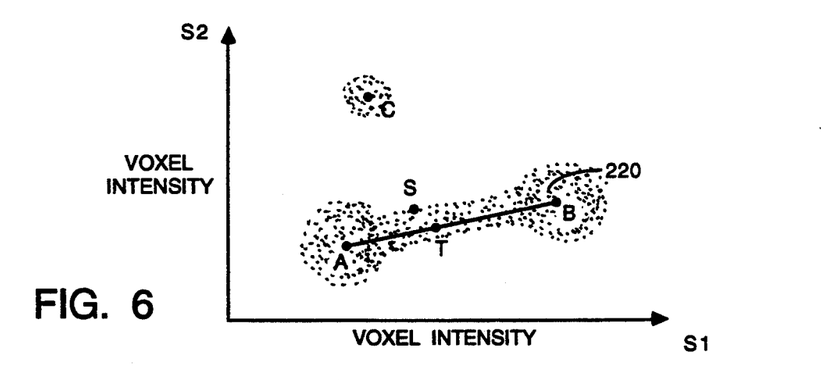
FIG. 6 is a graph of the feature space for the voxel intensity values in the two images in FIGS. 5A and 5B.

The first step in this process is to create a two-dimensional histogram of signal intensities in the two images S1 and S2 which histogram also is called feature space. The feature space is shown in FIG. 6 and is a two axes graph in which one axis represents the luminance intensity of voxels in image $S_1$, whereas the orthogonal axis represents the voxel intensity of the $S_2$ image. The feature space histogram is created by the computer system 100 forming a two-dimensional array of storage locations with the number of storage locations in each dimension of the array corresponding to a finite number of intensity gradations between pure black and white levels. The number within each storage location represents a count of the number of voxels of the $S_1$ and $S_2$ images which have the corresponding pair of intensity values. For example, a voxel that has maximum intensity value in the $S_2$ image with minimum intensity in the $S_1$ image would be counted in a memory location graphically depicted at the top of the $S_2$ axis. A voxel having a mid-intensity value in both the $S_1$ and $S_2$ images would be counted in a storage location at the center of the feature space array. The feature space array is created by the CPU 100 stepping through each voxel within the $S_1$ and the $S_2$ images and utilizing their two image intensities to find the corresponding feature space element. The contents of that element's memory location are incremented so as to provide a count of the number of voxels within the $S_1$ and the $S_2$ images having that intensity relationship.

FIG. 6 represents a two-dimensional plot of the storage locations in the feature array that have a voxel count stored in them. The voxels form two clusters having centroids A and B with voxels representing one type of tissue A (tumor tissue) clustered around centroid A and the voxels representing the other tissue type B (normal tissue) clustered around centroid B. The CPU 101 executes a center locating routine to find the center of each cluster at the ends of the dog bone shaped histogram distribution. In the ideal case, a voxel only has one type of tissue and would lie exactly at one of the centroids. However, since the tumor does not have edges which conform identically to the boundaries of the voxels, voxels at the perimeter of the tumor will be formed by a partial volume of normal tissue and a partial volume of tumor tissue. Similar mixture also may occur due to biological variability within the tumor. Ideally, such partial volume voxels would appear at locations on a line between centroids A and B in a position which corresponds to the proportion of normal tissue and tumor tissue. For example, a voxel having a greater amount of normal tissue than tumor tissue will lie on the line closer to centroid B, whereas the voxel with a greater proportion of tumor tissue will lie on the line closer to centroid A. The Euclidean distances from the centroids corresponds to those proportions. A voxel containing a mixture of the two types of tissue maps to a point T such that $T=f_A A+f_B B$, where $f_A$ and $f_B$ are fractional quantities of the voxel, or partial volumes, occupied by tissues A and B, respectively. This assumes that the image is made up of two types of tissue, $f_A+f_B=1$. Since the intensity level of the voxel corresponds to the proportion of the tumor and normal tissues, the partial volume of each tissue type can be determined from the voxel's position with respect to each centroid in feature space.

However, the intensity signals in the images $S_1$ and $S_2$ are non-ideal, being affected by electrical noise, motion artifacts, and other artifacts due to tissue inhomogeneity. In feature space, the signal intensities corresponding to a mixture of tissue types are convolved with a two-dimensional function, such as a Gaussian distribution describing the noise and artifacts. In the presence of noise, the signal intensities for the normal and tumor tissues become distributions centered about points A and B and the signal intensities of linear combinations of the two tissues also become distributions centered about line A—B between the two centroids. It is assumed that the noise is described by a Gaussian distribution and that it has the same standard deviation $\sigma$ in each of the original images. If the standard deviations and the noise distributions for the two images $S_1$ and $S_2$ are not the same, for example due to different receiver gains for two sets of image data acquired with the two different pulse sequences, one could normalize the intensities so that the standard deviations are the same. In an actual image, $\sigma$ can be estimated from the sample mean or the sample variance of background noise. In this case, a pixel value in region 214 of image $S_1$ represents a signal from air and can be used as a noise signal to determine the value of $\sigma$. The contrast-to-noise ratio (CNR) between tissues A and B is given by CNR=(AB)/$\sigma$, where AB is the distance between the centroids A and B.

Figure 7:
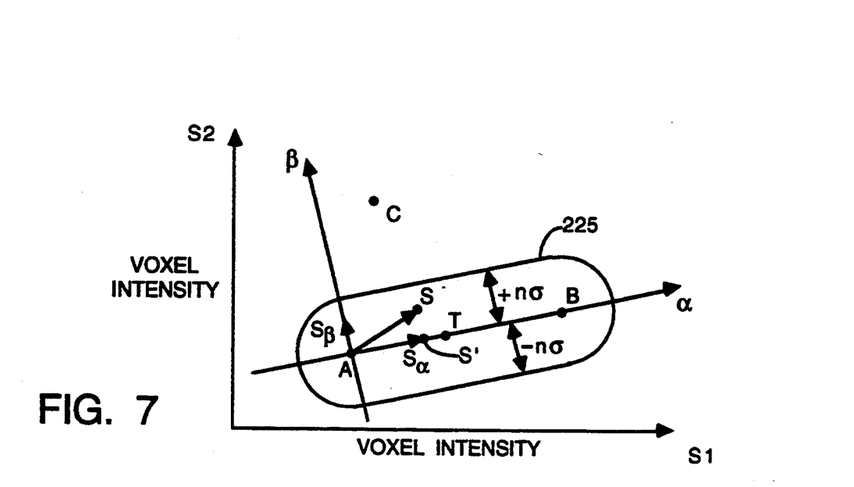
FIG. 7 is a graph of the feature space of FIG. 6 with an overlay of an orthogonal coordinate system employed to derive tissue type fractional quantity values for each voxel.

As a result, a voxel with true signal intensity relationship T may be observed at point S. A vector decomposition technique is employed to assign to each voxel fractional quantity contributed by the two different tissue types. To perform the vector decomposition, a translated and rotated coordinate system is utilized by the CPU 101 to analyze the relationship of centroids A and B and the observed signal intensity S. With reference to FIG. 7, this rotated $\alpha\beta$ Cartesian coordinate system has an origin at centroid A in the feature space with the directional from A to B as the positive $\alpha$ axis and the $\beta$ axis perpendicular to the $\alpha$ axis. Therefore, centroid A will be located at the origin, point (0,0) and centroid B will be at coordinates (AB,0) and point S will be at coordinates ($S_\alpha$, $S_\beta$). In defining the $\alpha\beta$ coordinate system, the CPU 101 derives the equation for a line passing through centroids A and B. This line becomes the $\alpha$-axis. An equation for the $\beta$-axis is derived from the equation for a line that passes through centroid A perpendicular to the $\alpha$-axis.

The vector AS can be decomposed into two orthogonal vectors $S_\alpha$ and $S_\beta$ along each axis with $S_\beta$ denoting the noise component and $S_\alpha$ locating the position of the observed voxel S on line AB, the calculated fractional quantities $f_A$ and $f_B$ derived from $S_\alpha$ are:

$$f_A = 1 - \frac{S_\alpha}{AB}$$

$$f_B = \frac{S_\alpha}{AB}$$

Note that vector $S_\alpha$ does not reach the true location T of the voxel. Rather, it reaches point S' which is an orthogonal projection of point S onto the $\alpha$-axis. Note also that a calculated fractional quantities can be less than zero or greater than one for points located beyond centroids A and B along the $\alpha$-axis. However, since the effects of noise have a Gaussian distribution, these errors will be averaged out by other values affected in the opposite manner.

Therefore, in an image having only two tissue types, each of the elements of the feature space will be vector decomposed to a projected point on the $\alpha$-axis. The fractional quantities of the two tissue types are derived from the Euclidean distances between that projected point and the respective centroids. However, such ideal two tissue cases typically do not exist. In practice, there will be one or more other tissue types within the $S_1$ and $S_2$ images. Therefore, the creation of the feature space array will produce other clusters of voxel intensities. For example, a third tissue type might be clustered about centroid C in a feature space of FIG. 6. Thus, the rudimentary of the vector decomposition would decompose the voxel intensity elements clustered about centroid C on to the $\alpha$ axis and assign calculated fractional quantity of tissue types A and B, whereas in fact these feature space elements represent a third tissue type.

In order to exclude feature space elements from other tissue types, a probability threshold boundary is created on either side of line A-B with the assumption that all valid points of tissue types A and B will lie within that boundary. It is assumed that all valid points of tissue types A and B will lie within n$\sigma$ of the line between points A and B, where n has a value of 4, for example. This boundary 25 is illustrated in FIG. 7. Thus, between points A and B, feature space elements that are within a threshold range n$\sigma$ from the $\alpha$-axis will be decomposed to produce their calculated fractional quantities. Similarly, feature space elements in a n$\sigma$ radius beyond points A and B also will be decomposed so that the fractional quantities may be calculated. Any feature space elements outside of this probability threshold boundary 225, such as those around centroid C, will be excluded under the assumption that they represent other types of tissue.

The process of vector decomposition is performed for each voxel in the images. For a given voxel (S), its position in feature space is determined and the vector AS is decomposed by CPU 101 to define component vector $S\alpha$. The projected point S' at the end of $S\alpha$ is resolved into a tissue A fractional quantity and a tissue B fractional quantity based on the relative position of that point to centroids A and B. Points outside the threshold n$\sigma$ are excluded from the calculations.

Figure 8A:
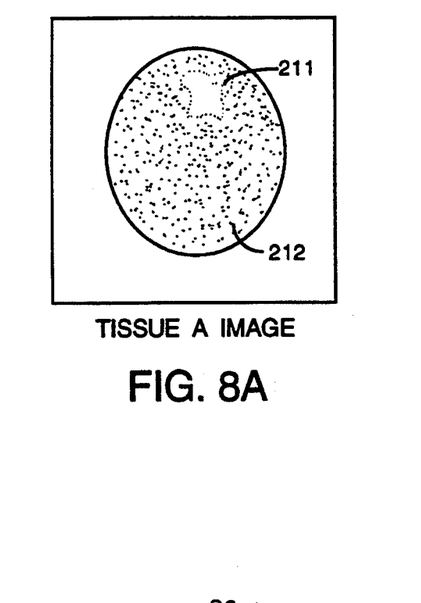
FIGS. 8A and 8B are a pair of tissue images produced by the fractional quantity values determined by the present invention.
Figure 8B:
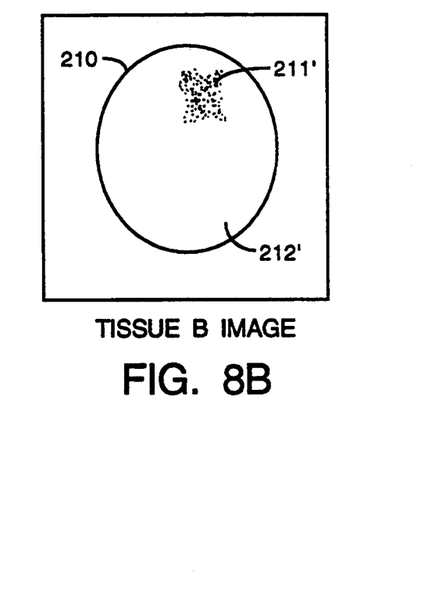

Two resultant images are created from these fractional quantities, a tissue A image and a tissue B image as illustrated in FIGS. 8A and 8B, respectively. Each voxel in the tissue A image has a value that corresponds to the tissue A fractional quantity computed above for the correspondingly located voxel in the $S_1$ and $S_2$ images. Thus, a voxel in the tissue A image will have a 60% full brightness value when that voxel is 0.60 type A tissue. Therefore, bright spots in tissue image A when displayed on operator console 116 denote type A tissue in the original images. Similarly each voxel in the tissue B image has a fractional quantity value that corresponds to the tissue B percentage computed for the correspondingly located voxel in the $S_1$ and $S_2$ images. The displayed tissue B image will have bright spots which denote type B tissue in the original images. The relative brightness of each voxel in the tissue B image is proportional to the fractional quantity of type B tissue in that voxel. Thus the tissue A and tissue B images are maps of how much each type of tissue are contained in the original image voxels. The two tissue images in FIGS. 8A and 8B are stored in the image disk 110 of the computer 100 and can be displayed on the CRT monitor of operator console 116.

In the above description, vector mathematics was employed to decompose each voxel's feature space location into a position on line A—B. Alternatively, matrix mathematics can be used to calculate the fractional quantities. As used herein, vector decomposition broadly refers to either the vector or matrix mathematical technique.

The fractional quantities stored in the two tissue images are particularly useful in calculating the volume of the tumor composed of the type A tissue. Because an image slice has some thickness, each voxel in the images produced by the NMR system represents a known volume V within the object being imaged, e.g. the patient's head. Therefore, a voxel that is 100% type A tissue in the example represents a volume V of tumor tissue. Correspondingly, a voxel with a fractional quantity of 0.50 type A tissue represents a tumor tissue volume of one-half V. The relationship between voxel intensity and tissue volume in the tissue images of FIGS. 8A and 8B is employed by the computer 100 to calculate the volume of a given type of tissue, e.g. tumor tissue, in the image. The volume calculation is done slice by slice.

In calculating the tumor volume, the CPU 101 accesses a type A tissue image data stored in image disk 110 and sequentially reads each voxel fractional quantity of that image. As discussed above, the voxel fractional quantity in the tissue image corresponds to the amount of that type of tissue in the volume represented by that voxel. Thus, each time the CPU 101 reads a voxel of the type A tumor tissue image, the voxel fractional quantity is multiplied by the voxel volume V. The product is summed with the products of all the tissue A image voxels and the result is a measurement of the tumor volume in that slice through the patient. The volume calculation for a slice is defined by the expression:

$$\text{Tumor Volume} = \sum_{i=1}^{m} (F_i) V$$

where $F_i$ is a voxel fractional quantity and m is the number of voxels having volume V in the tissue image. The tumor volume measurement can be displayed on the monitor of the main operator console 116 along with the type A image.

The calculated tumor volume represents the amount of tumor tissue in the image for one slice 240 of FIG. 3. As described above, multiple slices are taken through the desired region of interest, e.g. the patient's head. The above process is repeated for each slice image to produce a set of tumor volumes for the set of acquired slices. These slice tumor volumes are summed to produce a measurement of the total volume of the tumor.

The image processing described above derived data representing the relative volumes of two tissue types in the image. As noted, other types of tissue, such as type C, were excluded from the process by the threshold boundary 225. In another embodiment of the present invention, the volumes of three tissue types can be determined from the $S_1$ and $S_2$ images. This determination is premised on the assumption that the partial volumes of the three tissue types add up to 100% of all the tissue in every voxel. If a fourth tissue type mixes the other types in a voxel within the image region of interest, the individual partial volumes are unresolvable. However, a fourth tissue type outside the region of interest does not present a problem, as is the case for fat outside the brain.

Figure 9:
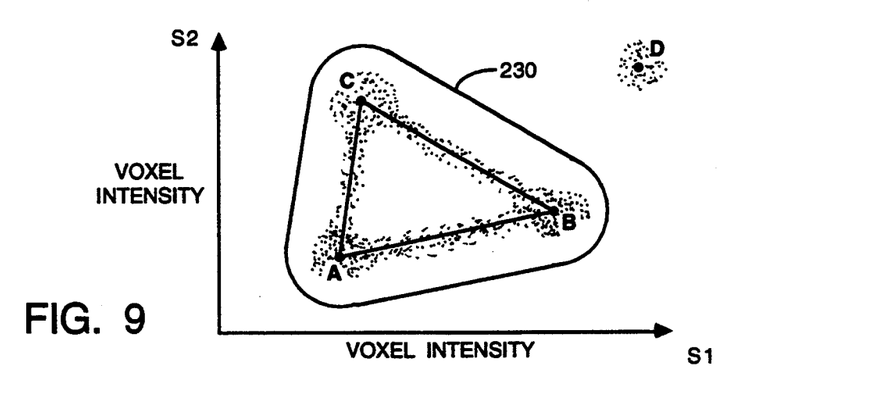
FIG. 9 is a graph of the feature space for the voxel intensity values for an alternative embodiment that derives fractional quantity values for three tissue types within the acquired images.

As shown in FIG. 9, ideally in a noiseless image, all of the tissue voxels will fall within a triangle ABC in feature space. However in reality, noise will cause some of the voxels in images $S_1$ and $S_2$ will map to points outside the triangle. Therefore as with the two tissue model described previously, a probability threshold boundary 230 is established around the three tissue cluster centroids A, B and C. The boundary is a distance $n\sigma$ outside of the triangle ABC. Such a boundary will exclude a fourth tissue type having feature space elements clustered about point D.

Figure 10A:
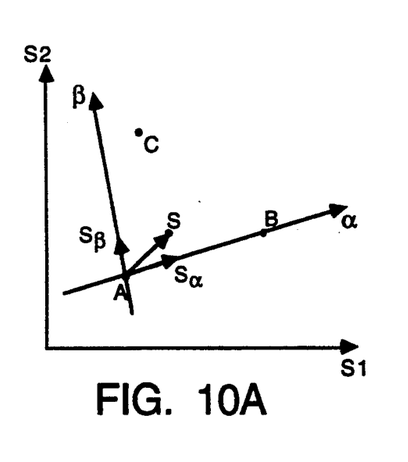
FIGS. 10A and 10B are graphs of the feature space of FIG. 9 overlays of two orthogonal coordinate systems employed to derive tissue type fractional quantity values for each voxel.

In order to determine the relative proportions of each of the three tissue types A, B and C in each voxel, a two step vector decomposition process is used. First, each voxel that is mapped into feature space within boundary 230 is decomposed onto the $\alpha$-axis on which two of the cluster centroids lie. For example as shown in FIG. 10A, a coordinate system $\alpha\beta$ is established with point A at the origin and the vectors decomposed onto the $\alpha$-axis and the probability threshold applied as was done in the two-tissue model discussed previously. From the decomposition, two tissue images A' and B' are produced based on the relative tissue type fractional quantities.

Figure 10B:
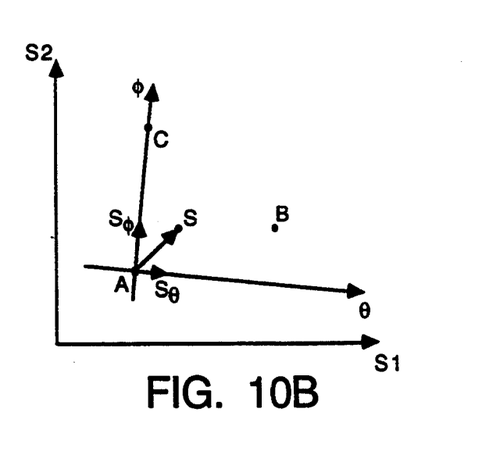

Then a second coordinate system $\phi\theta$ is established so that points A and C lie on the $\phi$ axis. The orthogonal $\theta$ axis extends through point A. The vectors for each voxel that maps into boundary 230 are decomposed onto the $\phi$ axis. The resultant vector $S\phi$ defines the fractional quantity of tissue types A and C within the given voxel. The vector decomposition is performed for each voxel in the $S_1$ and $S_2$ images and the fractional quantities are mapped onto another pair of tissue images A'' and C'' which are stored on the image disk 110.

The fractional quantity values for a given voxel in the four tissue images A', B', A'' and C'' can be compared and arithmetically processed to derive a fractional quantity for each of the three tissue types A, B and C. There are two sets of tissue images, one set has images A' and B' while the other set consists of images A'' and C'' with all four images being in registration. Therefore, the fractional quantities of tissue types A and B for a given voxel in tissue images A' and B' are defined by $f_{A'}+f_{B'}=1$, and in tissue images A'' and C'' the fractional quantities of tissue types B and C are given by $f_{A''}+f_{C''}=1$.

The fractional quantity $F_A$ of type A tissue in the given voxel is derived by averaging the values of $f_{A'}$ and $f_{A''}$. From that average, the combined fractional quantities $F_B$ and $F_C$ of the other two tissue types B and C in the given voxel is defined by the expression:

$$F_B + F_C = (1 - F_A)$$

From that relationship, the fractional quantities $F_B$ and $F_C$ for tissue types B and C, are calculated according to the expressions:

$$F_B = \frac{f_{B'}}{f_{B'} + f_{C''}} (1 - F_A)$$

$$F_C = \frac{f_{C''}}{f_{B'} + f_{C''}} (1 - F_A)$$

These expressions are solved to produce a trio of tissue fractional quantities $F_A$, $F_B$ and $F_C$ for each voxel in the image. The resultant fractional quantities are stored in three separate final tissue images A, B and C with each tissue image depicting the amount of that type of tissue in the imaged slice of the patient.

As with the two tissue model, the voxel volume and the tissue fractional quantities can be employed to calculate the volume of each type of tissue in every voxel of the image. Next, the voxel volumes of each tissue type are separately summed to derive the volume of a given tissue type in the slice. The process is repeated for each slice image and the volumes for all of the acquired slices then are summed to calculate a total volume of that tissue type.

Figure 11:
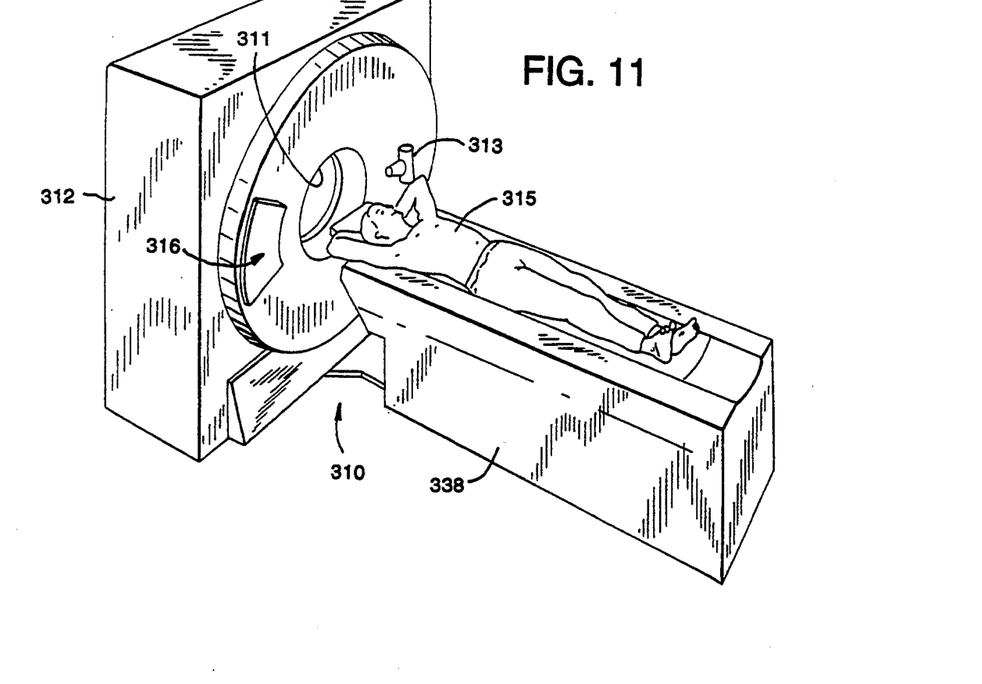
FIGS. 11 and 12 are block diagrams of a computed tomography system with which the present invention can be practiced.
Figure 12:
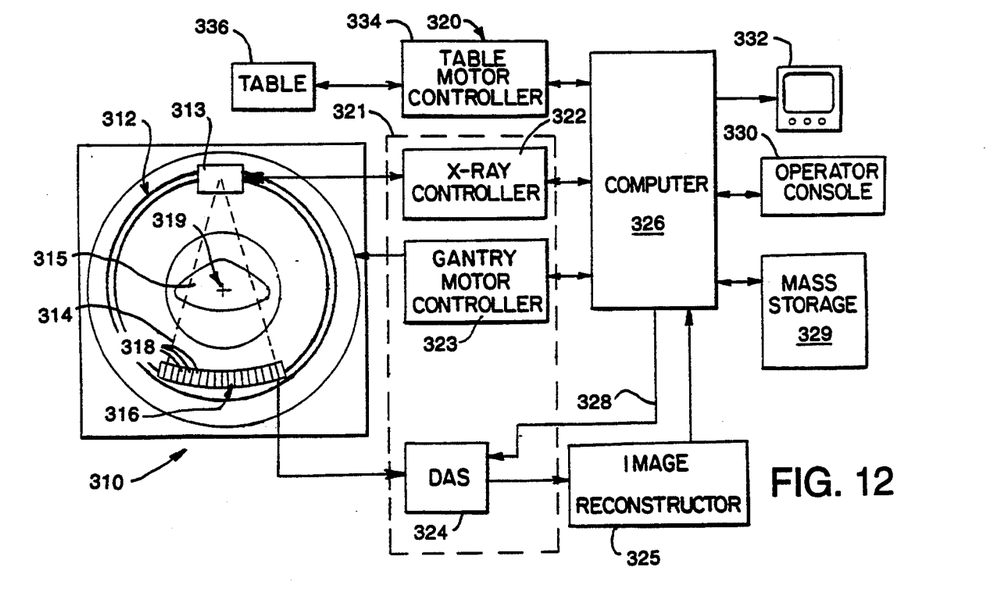

Although the present invention has particular application to magnetic resonance imaging systems, it can also be used to process images acquired by a computed tomography (CT) imaging system 310 illustrated in FIGS. 11 and 12. That system includes a gantry 312 which is representative of a "third generation" CT scanner having an X-ray source 313 oriented to project a fan beam of X-rays 314 through patient 315 to detector array 316. The detector array 316 is formed by a number of detector elements 318 which together detect a projected image resulting from the transmission of X-rays through the imaged patient 315. The gantry 312 and the components mounted thereon rotate about a center of rotation 319 located within the patient.

A control mechanism 320 of the CT system 310 has gantry associated control modules 321 which include an X-ray controller 322 which provides power and timing signals to the X-ray source 313, a gantry motor controller 323 that controls the rotational speed and position of the gantry 312, and a data acquisition system (DAS) 324 which samples projection data from detector elements 318 to produce a series of X-ray attenuation values. The data acquisition system 324 filters, amplifies, digitizes otherwise conditions the signal from each detector element 318. The data output from the DAS 324 is connected to a conventional image reconstructor 325 which performs high speed image reconstruction using the digitized projection data samples from the DAS 324, according to methods known in the art. The image reconstructor 325 may be an array processor, such as one manufactured by Star Technologies.

The X-ray controller 322 and the gantry motor controller 323 are connected to a computer 326 such as a Data General Eclipse MV/7800C general purpose minicomputer. The computer 325 also provides data processing and control signals to DAS 324 via buses 328. The computer 326 receives commands and scanning parameters via an operator console 330 that has a cathode ray tube display and keyboard which allows the operator to enter parameters for the scan and observe the reconstructed image and other information from the computer. A mass storage device 329 provides a means for storing operating programs for the CT imaging system, as well as image data for future reference by the operator.

During image acquisition, the X-ray source 313 and detector array 316 are rotated on a gantry 312 within the imaging plane and around the patient 315 so that the angle at which the X-ray beam 314 intersects the patient constantly changes. A group of X-ray attenuation measurements from the detector array at a given angle is referred to as a "view" and a "scan" of the patient comprises a set of views made at different angular orientations during one revolution of the X-ray source and detector. The gantry 312 may stop or continue to move as the measurements are being made and the image produced from the scan data corresponds to a two dimensional slice taken through the patient 315.

Typical CT systems are operated in either the axial mode or the helical scan mode. In the axial mode, the patient 315 being imaged remains stationary during each scan and the gantry 312 revolves once to complete a scan containing one slice through the patient. The gantry may make additional revolution to acquire image data at the same slice in order to observe temporal changes, such as occur in the heart at different stages of the cardiac cycle. In the helical scan mode, the gantry 312, with the X-ray source 313 and detector array 316, revolves continuously while the patient 315 moves through the imaging plane. In this mode, a table motor controller 334 causes the table 336 on which the patient lays to move through the gantry 312. Each revolution of the gantry, or scan, acquires projection data for another image slice through the patient, thus acquiring data in three dimensions in a single operation.

The resultant projection data are sent from the revolving detector array 316 through DAS 324 to the image reconstructor 325, which generates an image from the projection data. The prevailing method for reconstructing image is referred to in the art as the filtered back-projection technique. This process converts the attenuation measurements from a scan into integers called "CT numbers" or "Hounsfield units," which are used to control the brightness of a corresponding pixel on a cathode ray tube display 332. The image produces by the image reconstructor 325 is stored in the mass storage unit 329.

For the purposes of the present invention, the CT system 310 produces two different images of the same slice through the patient. The images are produced before and after a contrast agent has been injected into the patient to alter the contrast between two types of tissue in the slice images. This pair of CT images correspond to images $S_1$ and $S_2$ in FIGS. 5A and 5B created by the NMR imaging system. The computer 326 in the CT system 310 is programmed to process the pair of CT images in the same manner as described above for the NMR images. Specifically the computer 326 generates a feature space histogram for the CT image pair and from that feature space creates a separate tissue image for each tissue type of interest. The tissue images then are analyzed to determine the volume of a given type of tissue, such as tumor tissue.

The present invention also can be used to process one image $S_1$ from an NMR system and a second image $S_2$ produced by a CT system as long as the two images are registered to each other. Other medical imaging systems such as positron emission tomography (PET) can be used to produce one or both of the images used in the segmentation process.

Although being described herein in the context of processing medical images to segment different tissue types, the present invention can be used to process non-medical images to identify and separate features in images produced by a wide variety of imaging equipment.

The invention being claimed is:

1. A method for analyzing registered images of an object, steps of which comprise:
   (a) acquiring X images of the object where X is a positive integer, greater than one and wherein each image is formed by a two dimensional array of image elements;
   (b) creating a X-dimensional feature space histogram of intensity levels of the image elements in the X images;
   (c) locating a first centroid in the feature space histogram which centroid corresponds to a first feature in the X images;
   (d) locating a second centroid in the feature space histogram which centroid corresponds to a second feature in the X images;
   (e) defining a Cartesian coordinate system in the feature space histogram, wherein one axis of the Cartesian coordinate system passes through the first and second centroids;
   (f) decomposing a vector, that defines the location in the feature space histogram associated with a given image element, into a component vector along the one axis;
   (g) determining from the component vector, a fractional quantity of the first feature in the given image element;
   (h) repeating steps (f) through (g) for a plurality of image elements in one of the X images; and (i) deriving a measurement of a physical parameter of the first feature from a plurality of fractional quantities.

2. The method as recited in claim 1 wherein each element in the X images corresponds to an amount of space in the object; and further comprises:

separately multiplying the amount of space by each fractional quantity of the first feature determined at step (g) to produce a plurality of fractional measurements; and summing the plurality of fractional measurements to produce a total space measurement for the first feature.

3. The method as recited in claim 1 wherein the step of decomposing only decomposes vectors for points which are within a given threshold range on either side of the one axis.

4. A method for generating an image of an patient, steps of which comprise:
(a) transmitting electromagnetic radiation toward the patient;
(b) detecting electromagnetic radiation carrying image information from the patient;
(c) forming a first image and a second image from detected radiation wherein each of the first and second images is a two dimensional array of image elements;
(d) creating a two dimensional feature space histogram of intensity levels of the image elements in the first and second images;
(e) locating a first centroid for a first tissue type in the feature space histogram;
(f) locating a second centroid for a second tissue type in the feature space histogram;
(g) defining a Cartesian coordinate system in the feature space histogram wherein the Cartesian coordinate system has an origin at one of the first and second centroids and has one axis that passes through the first and second centroids;
(h) for a given image element in the first image, projecting an associated point in the feature space histogram onto a point on the one axis;
(i) determining from the point on the one axis a fractional quantity of the first type of tissue in the given image element;
(j) setting a value of an element in a first tissue image to the fractional quantity of the first type of tissue;
(k) repeating steps (h) through (j) for a plurality of image elements in the first image; and
(l) displaying the first tissue image.

5. The method as recited in claim 4 wherein each element in the first tissue image corresponds to an amount of space and further comprises:

separately multiplying the amount of space by the fractional quantity of the first type of tissue for each element in the first tissue image to produce a plurality of element tissue volumes; and summing all the element tissue volumes to produce a total volume measurement for the first type of tissue.

6. The method as recited in claim 4 wherein the step of projecting an associated point only projects points which are within a given threshold range on either side of the one axis.

7. The method as recited in claim 4 further comprising steps of:

(m) for the given image element determining from the point on the one axis a fractional quantity of the second type of tissue in the given image element;
(n) setting a value of an element in a second tissue image to the fractional quantity of the second type of tissue;
(o) repeating steps (m) through (n) for a plurality of image elements in the first image; and
(p) displaying the second tissue image.

8. The method as recited in claim 4 that is practiced by a magnetic resonance imaging system and wherein:

transmitting electromagnetic radiation sends a radio frequency signal at a Larmor frequency of nuclei of interest in the patient; and detecting electromagnetic radiation detects echo signals from the nuclei in the patient.

9. The method as recited in claim 4 that is practiced by a computed tomography imaging system and wherein:

the step of transmitting electromagnetic radiation sends a beam of X-rays toward the patient; and the step of detecting electromagnetic radiation senses the X-rays passing through the patient and produces a set of X-ray attenuation values.

10. A method for generating an image of a patient, steps of which comprise:
(a) detecting electromagnetic radiation carrying image information from the patient;
(b) forming a first image and a second image from detected radiation wherein each of the first and second images is a two dimensional array of image elements;
(c) creating a two-dimensional feature space histogram of intensity levels of the image elements in the first and second images;
(d) locating first, second and third centroids in the feature space histogram which centroids respectively correspond to first, second and third features in the first and second images;
(e) defining a first Cartesian coordinate system in the feature space histogram wherein one axis of the first Cartesian coordinate system passes through the first and second centroids;
(f) decomposing a vector that defines the location for a given image element in one of the plurality of images into a first component vector along the one axis;
(g) determining from the first component vector, a first fractional amount of the first feature in the given image element, and a second fractional amount of the second feature in the given image element;
(h) storing the first and second fractional amounts in a memory device;
(i) repeating steps (f) through (h) for a plurality of image elements in the one image; and
(j) defining a second Cartesian coordinate system in the feature space histogram wherein one axis of the second Cartesian coordinate system passes through the first and third centroids;
(k) decomposing a vector that defines the location for a given image element in one of the plurality of images into a second component vector along the one axis of the second Cartesian coordinate system;
(l) determining from the second component vector, a third fractional amount of the first feature in the given image element, and a fourth fractional amount of the third feature in the given image element;

(m) storing the third and fourth fractional amounts in a memory device;

(n) repeating steps (k) through (m) for a plurality of image elements in the first image;

(o) from first, second, third and fourth fractional amounts for each of a plurality of image elements in the first image, deriving fractional quantities for the first, second, and third features in each a plurality of image elements; and (p) utilizing the fractional quantities derived in step (o) to produce a measurement of a physical parameter of one of the first, second, and third features.

11. The method as recited in claim 10 wherein each element in the first and second images corresponds to an amount of space in the patient; and the step (p) comprises:

separately multiplying the amount of space by each fractional quantity of the first feature determined to produce a plurality of fractional measurements; and summing the plurality of fractional measurements to produce a total space measurement of the first feature.

12. The method as recited in claim 10 wherein the steps of decomposing only decompose vectors for points which are within a given threshold range on either side of the one axis of the respective Cartesian coordinate system.

* * * * *